US006232144B1

(12) United States Patent
McLoughlin

(10) Patent No.: US 6,232,144 B1
(45) **Date of Patent: *May 15, 2001**

(54) NICKEL BARRIER END TERMINATION AND METHOD

(75) Inventor: Neil McLoughlin, Blackrock (IE)

(73) Assignee: Littelfuse, Inc., Des Plaines, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/885,859

(22) Filed: Jun. 30, 1997

(51) Int. Cl.$^7$ .............................. H01L 21/00; H01L 21/16

(52) U.S. Cl. .......................... 438/104; 438/466; 438/608; 205/123; 205/136; 427/98; 427/305; 427/304; 427/430.1; 427/431; 427/438; 427/101; 427/102; 427/103; 338/20; 338/21; 361/321.3

(58) Field of Search .................................... 205/123, 136; 438/104, 466, 608; 427/98, 305, 304, 324, 430.1, 431, 438, 101, 102, 103; 338/20, 21; 361/321.3

(56) References Cited

U.S. PATENT DOCUMENTS 3,318,726 * 5/1967 Zimmerman .
3,725,836 * 4/1973 Wada et al. .
4,160,748 * 7/1979 Yodogawa et al. .
4,290,041 * 9/1981 Utsumi et al. .
4,316,171 * 2/1982 Miyabayashi et al. .
4,417,227 * 11/1983 Hennings et al. .
4,425,378 * 1/1984 Maher .
4,448,806 * 5/1984 Levinson .
4,555,414 * 11/1985 Hoover et al. .
4,613,518 * 9/1986 Ham et al. .
4,726,965 * 2/1988 Zondler .
4,811,164 * 3/1989 Ling et al. .
4,853,320 * 8/1989 Jacobs et al. .
4,906,512 * 3/1990 Roess .
4,924,205 * 5/1990 Caporali et al. .
5,021,921 * 6/1991 Sano et al. .
5,034,709 * 7/1991 Azumi et al. .
5,091,223 * 2/1992 Mori et al. .
5,093,774 * 3/1992 Cobb .
5,116,480 * 5/1992 Palnik .
5,138,298 * 8/1992 Shino .
5,147,692 * 9/1992 Bengston .

* cited by examiner

*Primary Examiner*—John F. Niebling
*Assistant Examiner*—David A. Zarneke
(74) *Attorney, Agent, or Firm*—Carter, Ledyard & Milburn

(57) ABSTRACT

A method of providing nickel barrier end terminations for a zinc oxide semiconductor device with exposed body surfaces and end terminal regions, in which the device is controllably reacted with a nickel plating solution only on an exposed end terminal region and thereafter provided with a final tin or tin-lead termination.

35 Claims, 1 Drawing Sheet

NICKEL BARRIER END TERMINATION AND METHOD

This is a division of, application Ser. No. 08/885,859, filed Jun. 30, 1997.

BACKGROUND OF THE INVENTION

The present invention relates to nonlinear resistive devices, such as varistors, and more particularly to methods of making such devices using controllable plating techniques in which the exposed end terminals of the device are plated with nickel barrier terminations while the exposed semiconductor body remains unplated.

Nonlinear resistive devices are known in the art, and are described, for example, in U.S. Pat. No. 5,115,221 issued to Cowman on May 19, 1992, and is incorporated by reference.

With reference to the prior art shown in FIG. 1, a typical device 10 may include plural layers 12 of semiconductor material with electrically conductive electrodes 14 between adjacent layers. A portion of each electrode 14 is exposed in a terminal region 16 so that electrical contact may be made therewith. The electrodes 14 may be exposed at one or both of opposing terminal regions, and typically the electrodes are exposed at alternating terminal regions 16 as illustrated. The exposed portions of the electrodes 14 are contacted by electrically conductive end terminals 18 that cover the terminal regions 16.

While an apparently simple structure, the manufacture of such devices has proved complex. For example, the attachment of the end terminals 18 has proved to be a difficult problem in search of a simplified solution. Desirably, the terminal regions 16 may be plated with nickel and tin-lead metals to increase solderability and decrease solder leaching. The process parameters in plating nickel to zinc oxide semiconductor bodies has proved particularly vexing and has required complex solutions.

One method of affixing the end terminals 18 is to use a conventional barrel plating method in which the entire device is immersed in a plating solution. However, the stacked layers are semiconductor material, such as zinc oxide, that may be conductive during the plating process so that the plating adheres to the entire surface of the device. Thus, in order to provide separate end terminals as shown in FIG. 1, a portion of the plating must be mechanically removed after immersion, or covered before immersion with a temporary plating resist comprised of an organic substance insoluble to the plating solution. However, the removal of the plating or organic plating resist is an extra step in the manufacturing process, and may involve the use of toxic materials that further complicate the manufacturing process.

It has also been suggested that the metal forming the end terminals 18 be flame sprayed onto the device, with the other portions of the surface of the device being masked. Flame spraying is not suitable for many manufacturing processes because it is slow and includes the creation of a special mask, with the additional steps attendant therewith. See, for example, U.S. Pat. No. 4,316,171 issued to Miyabayashi, et al. on Feb. 16, 1982.

It is also known to react a semiconductor body, having electrically conductive metal end terminations, with phosphoric acid to selectively form a phosphate on the semiconductor body prior to providing end terminations using conventional barrel plating. See, U.S. Pat. No. 5,614,074 issued to Ravindranathan on Mar. 25, 1997.

As illustrated by the above known methods, a simplified manufacturing process for the attachment of the end terminals 18 has proved to be a illusive.

Accordingly, it is an object of the present invention to provide a novel method and device that obviates many of the prior art problems.

Accordingly, it is an object of the present invention to provide a novel method of manufacturing a semiconductor device by controllably reacting an exposed zinc oxide semiconductor device having an exposed end terminal region with a nickel plating solution to form a nickel barrier end termination over the semiconductor body end without plating the entire exposed semiconductor device.

It is another object of the present invention to provide a novel method of providing a semiconductor device by controllably partially immersing an exposed semiconductor body having a silver termination with a nickel plating solution while applying a biasing current to form a nickel barrier cap extending a selected distance up the exposed body of the semiconductor device.

It is yet another object of the present invention to provide a novel method of providing a semiconductor body with a nickel barrier cap without the use of a plating resist by positioning an exposed end of the semiconductor body a selectable distance into a nickel plating solution for a controlled period.

It is still another object of the present invention to provide a novel method of providing metal termination of an exposed semiconductor body by contacting an end of the semiconductor body with an absorbent material impregnated with a nickel plating solution.

It is a further object of the present invention to provide a novel semiconductor device having naturally formed nickel terminations over a body of resistive plates interleaved between zinc oxide layers.

It is yet a further object of the present invention to provide a novel method of directly nickel plating zinc oxide bodies having a preferred zinc oxide volume resistivity for the plating method selected.

It is still a further object of the present invention to provide a novel method of manufacturing zinc oxide semiconductor devices minimizing solder leaching by providing a platinum-free and palladium-free silver termination and thereupon forming a nickel barrier termination.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
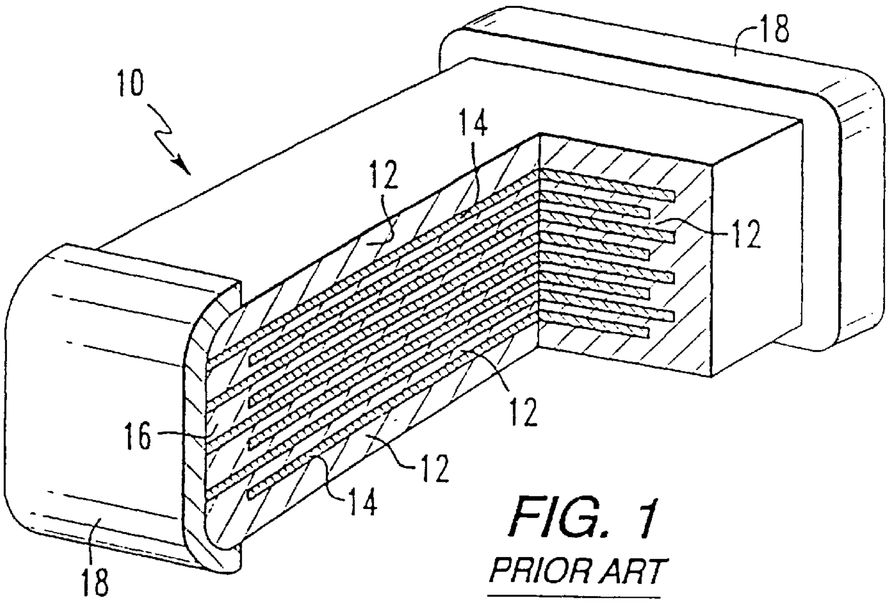
FIG. 1 PRIOR ART
FIG. 1 is a pictorial depiction of a prior art varistor.
Figure 2:
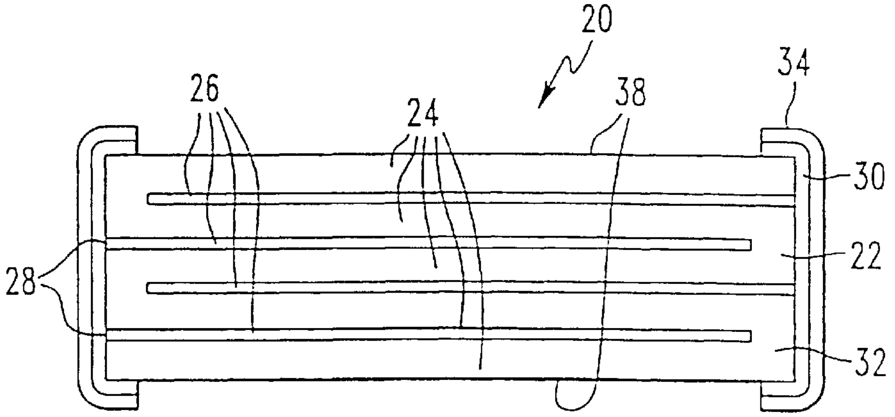
FIG. 2 is a vertical cross section of an embodiment of the device of the present invention.

With reference now to FIG. 2, an embodiment of a nonlinear resistive element 20 may include a body 22 having stacked zinc oxide semiconductor layers 24 with generally planar electrodes 26 between adjacent pairs of layers 24. The zinc oxide layers 24 need not be comprised of pure zinc oxide and may be comprised of a ceramic consisting principally of zinc oxide. Each electrode 26 may have a contactable portion 28 that is exposed for electrical connection to nickel barrier end terminations 30 that cover terminal regions 32 of the body 22 and contact the electrodes 26. The exterior portion of body 22 not covered with the end terminations 30 remain as exposed zinc oxide surface 38. Nickel barrier end terminations 30 may be plated with layers 34 of electrically conductive, solderable tin or tin-lead metal that form electrically contactable solderable end portions for the resistive element 20.

Figure 3:
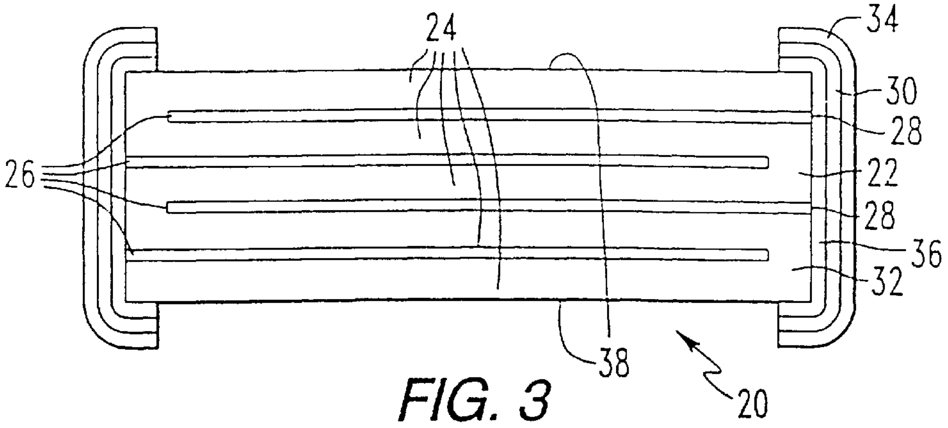
FIG. 3 is a vertical cross section of another embodiment of the device of the present invention.

With further reference to FIG. 3, in another embodiment of a nonlinear resistive manufactured using the method of the present invention, element 20 includes body 22 having stacked zinc oxide semiconductor layers 24 and generally planar electrodes 26 between adjacent pairs of layers 24. Each electrode 26 may have a contactable portion 28 exposed for electrical connection to a first electrically conductive metal (preferably silver, platinum-free silver, or palladium-free silver) end terminations 36 with nickel barrier end terminations 30 thereupon, covering terminal regions 32 and extending a desired distance along body 22. As with the embodiment illustrated by FIG. 2, nickel barrier end terminations 30 may be plated with layers 34 of solderable tin or tin-lead metal that form final electrically contactable end portions for the resistive element 20.

By way of example, in one embodiment the zinc oxide layers 24 may have the following composition in mole percent: 94–98% zinc oxide and 2–6% of one or more of the following additives; bismuth oxide, cobalt oxide, manganese oxide, nickel oxide, antimony oxide, boric oxide, chromium oxide, silicon oxide, aluminum nitrate, and other equivalents.

In a first embodiment of the method of the present invention, body 22 may be provided conventionally, electrodes 26 having contactable portions 28 exposed for electrical connection at terminal regions 32 with the remaining portions of body 22 being exposed zinc oxide surface 38. Process parameter control to avoid process boundary problems including: 1) plating not occurring, 2) plating not uniformly covering terminal regions 32, 3) plating too thick or thin; and 4) plating spread beyond the desired terminal region 32 onto exposed zinc oxide surface 38, requires the selection of nickel plating solution appropriate for an intended method of nickel barrier end termination plating—electro-plating, electroless plating, or brush plating. Having determined the method of nickel plating, an end of body 22 controllable contacts the nickel plating solution to form a desirably thick nickel barrier end terminations 30 over terminal region 32. Complimentary parameter processes selection, identification of nickel plating solution, plating method, and controllable contact assures that nickel barrier end terminations 30 uniformly cover terminal region 32 without extending undesirably along exposed surface 38 and while avoiding unacceptable zinc oxide etching, which etching is known to cause electrical leakage currents and mechanical weakness in the final device.

With the appropriate parameter selection, the method of the present invention desirable allows the temperature of the nickel plating solution to remain uncontrolled such that the solution remains at approximately room temperature. The pH of the nickel plating solution may be maintained between 2 and 6. Contact between semiconductor body 22 and nickel plating solution may vary from 15 to 120 minutes to allow the formation of end termination 30 with a thickness between 1 and 3 um.

One embodiment of the present invention further includes forming solderable contact 34 over end termination 30 by controllably immersing the nickel termination 30 into a room temperature solution containing one of Alkyl-tin, Alkyl-tin-lead, Tin-Lead sulfuric acid, or tin sulfuric acid having a pH from 2 to 6. The partial immersion may vary in the range from 10 to 120 minutes to allow the formation of solderable contact 34 with a cap thickness ranging from 3 to 6 um. Desirably, solderable contact plating may include application of a biasing current of approximately 0.3 to 2.0 $A/dm^2$.

Another embodiment of the present invention is preferably suited to electroless and brush plating methods for forming nickel end terminations 30. For this embodiment, a nickel plating solution comprising a room temperature solution of nickel sulphate, dimethylamineborane, lactic acid, ammonium citrate, and ammonia may be used in combination with semiconductor body 22 having zinc oxide layers 24 with a resistivity in the range from $10^{10}$ to $10^{12}$ Ohms/cm. The pH of the nickel plating solution may be maintained between 2 and 6.

For electroless plating, one end of semiconductor body 22 is positioned a selectable distance into the nickel plating solution covering that end of body 22 and allowing the plating solution to travel up a portion of exposed zinc oxide surface 38. Maintaining body 22 immersed for a period of 15 to 120 minutes provides for a nickel cap between 1 and 3 um.

For brush plating, a suitable absorbent material is impregnated with the nickel plating solution. One end of semiconductor body 22 is placed in contact with the impregnated absorbent material such that terminal region 32 completely contacts the absorbent material. Pressure between body 22 and absorbent material is maintained to allow formation of nickel end termination 30 on terminal region 32 and a desired distance along exposed zinc surface 38. The contact period may vary between 15 and 120 minutes to control termination 30 thickness and travel up surface 38. Relative motion may be provided so that semiconductor body 22 moves relative to the absorbent material.

In another embodiment of the present invention, particularly suitable for electroplating, a first electrically conductive metal end termination 36 is provided intermediate end termination 30 and body 20 and further includes providing a nickel plating solution comprising one of nickel sulphate or nickel chloride, boric acid, a wetting agent, and a stress relieving agent with the plating solution maintained at a temperature of 50 to 70° C. First end termination 36 material may preferably comprise silver, platinum-free silver, and/or palladium-free silver and glass frit. The use of platinum-free and/or palladium-free silver reduces the cost of device manufacture. The silver/glass frit material may be conventionally applied onto opposing ends of body 20 and fired to mechanically bond the silver/glass frit materials to terminal regions 32 forming first end terminations 36. Firing temperatures of 550 to 800° C. have provided favorable results.

Body 20 with first end termination 36 is partially immersed into the nickel plating solution for a period from 15 to 120 minutes while applying biasing current of 0.3 to 2.0 $A/dm^2$. Variously controlling immersion depth, immersion time, and biasing current will control nickel barrier termination 30 thickness and travel upward along exposed zinc surface 38.

Optionally, a final solderable termination may be provided over nickel end termination 30 using a room temperature solution of one of Alkyl-tin, Alkyl-tin-lead, Tin-Lead sulfuric acid, or tin sulfuric acid. Solder plating solutions having a pH in the range of approximately 3 to 6 have been suitable when layers 34 are formed with an immersion period ranging from 10 to 120 minutes and a biasing current of 0.3 to 2.0 A/$dm^2$. In the present invention, solder leaching is minimized without the use of more expensive platinum or palladium by coating first end termination 36 with nickel termination 30 so as to avoid silver leaching when the varistor device is soldered to a board.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A method of making a semiconductor device, the body of the semiconductor device having an exposed zinc oxide surface and nickel end terminations, the method comprising the steps of:

(a) providing a semiconductor body having electrically conductive plates interleaved with zinc oxide layers;

(b) providing a selected nickel plating solution for an intended method of nickel plating; and (c) controllably contacting an end of the semiconductor body with the nickel plating solution in order to form a desirably thick nickel barrier cap over the end of the semiconductor body without forming a nickel barrier cap over the entire semiconductor body.

2. The method of claim 1, wherein the temperature of the nickel plating solution is uncontrolled and remains at approximately room temperature.

3. The method of claim 1, wherein the pH of the nickel plating solution is maintained between about 2 and about 6.

4. The method of claim 1, wherein contact between the semiconductor body and the nickel plating solution is maintained for a period of approximately 10 to 120 minutes.

5. The method of claim 4, where contact between the semiconductor body and the nickel plating solution is maintained until the thickness of the nickel barrier cap is between approximately 1 and 3 um.

6. The method of claim 1, further comprising the step of forming an solderable contact by partially immersing the nickel barrier cap in an acid solution comprising one or more of Alkyl-Tin, Alkyl-Tin-Lead, Tin-Lead sulphuric acid, or Tin sulphuric acid with a pH between about 3 to about 6 at room temperature.

7. The method of claim 6, wherein the immersion of the nickel barrier cap in the acid solution is for a period of about 10 to about 120 minutes.

8. The method of claim 7, further including the application to the nickel barrier cap of a biasing current of approximately 0.3 to 2.0 A/$dm^2$.

9. The method of claim 7, wherein the immersion of the nickel barrier cap in the acid solution continues until a solderable contact having a thickness of 3 to 6 um is formed.

10. The method of claim 1, wherein the nickel plating solution is a room temperature solution comprising one or more of nickel sulphate, dimethylamineborane, lactic acid, ammonium citrate, and ammonia.

11. The method of claim 10, wherein the zinc oxide layers have a resistivity in the range from about $10^{10}$ to about $10^{12}$ Ohms/$cm^2$.

12. The method of claim 1, wherein the contact is by partial immersion in the nickel plating solution.

13. The method of claim 12, including the further steps of applying a termination material comprising silver and glass frit onto the end of the semiconductor body; and firing the semiconductor body to mechanically bond the termination material with the end of the semiconductor body.

14. The method of claim 13, wherein the termination material is essentially free of platinum and palladium; and wherein the termination material is fired at a temperature between about 550 and 800° C.

15. The method of claim 13, wherein the nickel plating solution includes one or more of (i) nickel sulphate or nickel chloride, (ii) boric acid, (iii) a wetting agent, and (iv) a stress relieving agent at a temperature of about 50 to 70° C.

16. The method of claim 15, including the further step of applying a biasing current of about 0.3 to about 2.0 A/$dm^2$ during nickel plating.

17. The method of claim 16, wherein the biasing current is variably dependent on the area of the end of the semiconductor to be coated.

18. The method of claim 12, wherein the immersion depth of the semiconductor body ia controlled to thereby selectively control the distance that the barrier cap extends upwardly from the end of the semiconductor body.

19. The method of claim 1, wherein the controllable contact is by impregnated absorbent material.

20. A method of providing a semiconductor device having a body with an exposed zinc oxide surface and electrically conductive, solderable metal end terminations, the method comprising the steps of:

(a) providing a semiconductor body having electrically conductive plates interleaved with zinc oxide layers;

(b) applying a termination material comprising silver and glass frit onto opposing ends of the semiconductor body;

(c) mechanically bonding the termination material to the ends of the semiconductor body by firing;

(d) providing at a temperature of about 50 to 70° C. a nickel plating solution comprising one or more of (i) nickel sulphate or nickel chloride, (ii) boric acid, (iii) a wetting agent, and (iv) a stress relieving agent;

(e) coating a silver terminated end of the semiconductor body by selectively partially immersing the end of the semiconductor body in the nickel plating solution for a period of about 15 to about 120 minutes while applying a biasing current of about 0.3 to 2.0 A/$dm^2$ to thereby form a desirably thick nickel barrier cap in contact with the silver terminated end which extends a selected distance up the body of the semiconductor device without forming a nickel barrier cap over the entire semiconductor body;

(f) providing a final termination solution of one or more of alkyl-tin, alkyl-tin-lead, tin-sulfuric acid or tin-lead-sulfuric acid, having a pH from about 3 to about 6 and an uncontrolled temperature; and (g) forming a desirably thick, electrically conductive, solderable contact end termination over the nickel barrier cap by selectively partially immersing the end of the semiconductor body into the final termination solution for a period of about 10 to about 120 minutes while applying a biasing current of about 0.3 to about 2.0 A/$dm^2$.

21. The method of claim 20, wherein the pH of the nickel plating solution is maintained between about 2 and about 6.

22. The method of claim 20, wherein the silver termination material is provided free of platinum and palladium and is fired onto the semiconductor body at a temperature between about 550 and about 800° C.

23. The method of claim 20, wherein the partial immersion of the semiconductor body in the nickel plating solution is continued until the thickness of the nickel coating is between about 1 and about 3 um.

24. The method of claim 20, wherein the solderable contact is about 3 to about 6 um thick.

25. The method of claim 20, wherein the distance that the barrier cap extends from the end of the semiconductor body is controlled by controlling the immersion depth.

26. The method of claim 20, wherein the biasing current is varied as a function of the area of semiconductor to be coated.

27. A method of providing metal end terminations to a semiconductor device without the use of a plating resist comprising the steps of:

(a) providing a semiconductor body having a zinc oxide exterior with electrically conductive elements interleaved between ceramic layers consisting principally of zinc oxide;

(b) providing a nickel plating solution comprising one or more of nickel sulphate, dimethylamineborane, lactic acid, ammonium citrate, and ammonia at room temperature;

(c) positioning one end of the semiconductor body a selectable distance into the nickel plating solution for a period of about 15 to about 120 minutes to thereby form a desirably thick nickel barrier cap over the end of the semiconductor body without forming a nickel barrier cap over the entire semiconductor body;

(d) providing a metal termination solution of either: alkyl-tin, alkyl-tin-lead, tin-sulfuric acid, or tin-lead-sulfuric acid, having a pH between about 3 to about 6 without forming a nickel barrier cap over the entire semiconductor body; and (e) forming a metal termination over the nickel barrier cap by partially immersing an end of the semiconductor body into the metal termination solution for a period of about 10 to about 120 minutes while applying biasing current of about 0.3 to about 2.0 $A/dm_2$.

28. The method of claim 27, wherein the pH of the nickel plating solution is maintained between about 2 and about 6.

29. The method of claim 27, wherein the semiconductor body is immersed in the nickel plating solution until the thickness of the nickel coating is between about 1 and about 3 um.

30. The method of claim 27, wherein the nickel barrier cap is coated with a solderable contact 3 to 6 um thick.

31. The method of claim 27, further including the step of providing a silver fired termination on the end of the semiconductor body prior to partial immersion in the nickel plating solution.

32. The method of claim 27, wherein the zinc oxide resistivity is between about $10^{10}$ to about $10^{12}$ $Ohms/cm^2$.

33. A method of providing a metal termination on a semiconductor device comprising the steps of:

(a) providing a semiconductor body having a zinc oxide exterior with electrically conductive elements interleaved between ceramic layers consisting principally of zinc oxide;

(b) providing at room temperature a nickel plating solution comprising one or more of nickel sulphate, dimethylamineborane, lactic acid, ammonium citrate, and ammonia;

(c) impregnating an absorbent material with the nickel plating solution;

(d) positioning one end of the semiconductor body in contact with absorbent material for a period of about 15 to about 120 minutes to thereby form a desirably thick nickel barrier cap covering that end of the semiconductor body and a selected portion of the body of the semiconductor device immediately contiguous thereto without forming a nickel barrier cap over the entire semiconductor body;

(e) providing a metal termination solution of one or more of: alkyl-tin, alkyl-tin-lead, tin-sulfuric acid, or tin-lead-sulfuric acid having a pH between about 3 and about 6; and (f) forming a desirably thick metal termination over the nickel barrier cap by partially immersing an end of the semiconductor body into the metal termination solution for a period of about 10 to about 120 minutes while applying a biasing current of about 0.3 to about 2.0 $A/dm_2$.

34. The method of claim 33, wherein the semiconductor body is maintained in contact with the absorbent material for a period sufficient to form a nickel barrier thickness of about 1 to about 3 um.

35. The method of claim 33, including the further step of moving the semiconductor body relative to the absorbent material.

* * * * *